(12) United States Patent
Gao et al.

(10) Patent No.: US 12,527,149 B2
(45) Date of Patent: Jan. 13, 2026

(54) LIGHT-EMITTING DEVICE, MATERIAL SCREENING METHOD AND DISPLAY PANEL

(71) Applicant: Yungu (Gu'an) Technology Co., Ltd., Hebei (CN)

(72) Inventors: Yu Gao, Hebei (CN); Mengyu Liu, Hebei (CN); Zhi Huang, Hebei (CN); Xiaowen Wang, Hebei (CN); Junzhe Liu, Hebei (CN); Jiaxin Sun, Hebei (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 431 days.

(21) Appl. No.: 18/178,826

(22) Filed: Mar. 6, 2023

(65) Prior Publication Data

US 2023/0209981 A1 Jun. 29, 2023

Related U.S. Application Data

(63) Continuation of application No. PCT/CN2021/117824, filed on Sep. 10, 2021.

(30) Foreign Application Priority Data

Dec. 15, 2020 (CN) .......................... 202011476865.7

(51) Int. Cl.
*H10K 50/11* (2023.01)
*H10K 50/18* (2023.01)
(Continued)

(52) U.S. Cl.
CPC ............. *H10K 50/11* (2023.02); *H10K 50/18* (2023.02); *H10K 71/70* (2023.02); *H10K 2101/00* (2023.02); *H10K 2101/40* (2023.02)

(58) Field of Classification Search
CPC ........ H10K 50/11; H10K 50/18; H10K 71/70; H10K 2101/00; H10K 2101/40;
(Continued)

(56) References Cited

U.S. PATENT DOCUMENTS

2005/0048317 A1  3/2005  Seo et al.
2019/0115554 A1  4/2019  Xie
2022/0302403 A1  9/2022  Liu et al.

FOREIGN PATENT DOCUMENTS

CN   102906895 A      1/2013
CN   107919442 A  *  10/2017
(Continued)

OTHER PUBLICATIONS

Office Action issued on Feb. 27, 2024, in corresponding Japanese Application No. 2023-519059, 6 pages.
(Continued)

*Primary Examiner* — Mohammad A Rahman
(74) *Attorney, Agent, or Firm* — Maier & Maier, PLLC

(57) ABSTRACT

A light-emitting device, a material screening method and a display panel. The light-emitting device of a first aspect of the present application includes a light-emitting layer including a host material and a guest material. When a carrier is injected into the light-emitting layer, there is a defect energy Et between the host material and the guest material, and an absolute value of the defect energy Et is greater than or equal to 0.03 eV. A light-emitting efficiency of the light-emitting device in a high-luminance state is improved and an operating voltage of the light-emitting device is reduced, which can ensure a display quality of the display panel in the high-luminance state and reduce an overall power consumption of the display panel.

18 Claims, 4 Drawing Sheets

(51) Int. Cl.
*H10K 71/70* (2023.01)
*H10K 101/00* (2023.01)
*H10K 101/40* (2023.01)

(58) Field of Classification Search
CPC .... H10K 50/15; H10K 50/16; H10K 2101/10; H10K 50/12
See application file for complete search history.

(56) References Cited

FOREIGN PATENT DOCUMENTS

| | | | |
|---|---|---|---|
| CN | 108987592 A | | 12/2018 |
| CN | 108987593 A | | 12/2018 |
| CN | 109256474 A | | 1/2019 |
| CN | 109728177 A | | 5/2019 |
| CN | 111326663 A | | 6/2020 |
| CN | 111697146 A | * | 6/2020 |
| CN | 111697147 A | | 9/2020 |
| JP | 2013505565 A | | 2/2013 |
| JP | 201916788 A | | 1/2019 |
| KR | 1020120080609 A | | 7/2012 |
| KR | 1020190004236 A | | 1/2019 |
| TW | 441221 B | | 6/2001 |

OTHER PUBLICATIONS

Office Action issued on Feb. 27, 2025, in corresponding Chinese Application No. 202011476865.7, 10 pages, with partial English translation.
Office Action issued on May 21, 2024, in corresponding Korean Application No. 10-2023-7009498, 9 pages.
International Search Report mailed Dec. 8, 2021, in International Application No. PCT/CN2021/117824, 8 pages.
Extended Search Report issued on Jan. 25, 2024, in corresponding Euroean Application No. 21905150.5, 11 pages.
Staudigel et al., "Activation Energies in Organic Light Emitting Diodes Comprising Ohmic Contacts Both for Electron and Hole Injection", Synthetic Metals, Elsevier Science S.A., Jun. 1, 2000, vols. 111-112, 5 pages.
Sylvinson et al., "Rapid Multiscale Computational for OLED Host Materials", Applied Materials & Interfaces, ACS Publications, American Chemical Society, Jan. 14, 2019, vol. 11, No. 5, 13 pages.
Office Action issued on Sep. 10, 2025, in corresponding Korean Application No. 10-2023-7009498, 8 pages.

* cited by examiner

LIGHT-EMITTING DEVICE, MATERIAL SCREENING METHOD AND DISPLAY PANEL

CROSS-REFERENCE TO RELATED APPLICATIONS

This application is a continuation of International Application No. PCT/CN2021/117824, filed on Sep. 10, 2021, which claims priority to Chinese Patent Application No. 202011476865.7, entitled "Light-emitting device, material screening method and display panel", filed on Dec. 15, 2020, both of which are hereby incorporated by reference in their entireties.

TECHNICAL FIELD

The present application relates to the technical field of display, and in particular to a light-emitting device, a material screening method and a display panel.

BACKGROUND

At present, Organic Light-Emitting Diode (OLED) display panels tend to be developed in a direction of high-luminance display, so it is urgent to improve a light-emitting efficiency of a light-emitting device in a high-luminance display state. Increasing the light-emitting efficiency by increasing an opening area of the light-emitting device generally needs to be at the expense of pixel density and is also accompanied by an increase in a power consumption of a display panel, thereby affecting a use performance of the display panel and increasing a cost of use.

SUMMARY

The present application provides a light-emitting device, including: a light-emitting layer including a host material and a guest material, wherein when a carrier is injected into the light-emitting layer, there is a defect energy Et between the host material and the guest material, and an absolute value of the defect energy Et is greater than or equal to 0.03 eV.

The light-emitting device provided in the present application improves the light-emitting efficiency in the high-luminance display state and reduces an operating voltage of the light-emitting device, which reduces an overall power consumption of the display panel while ensuring a display quality of the display panel in the high-luminance display state.

The present application provides a material screening method for screening a light-emitting layer material of a green or red light-emitting device, including: configuring a plurality of light-emitting material groups, each of the light-emitting material groups including a host material and a guest material, at least one of the host material and the guest material in each of every two of the light-emitting material groups is different from each other; respectively fabricating a plurality of single-carrier devices using each of the light-emitting material groups as a light-emitting layer material, wherein each of the plurality of single-carrier devices has a light-emitting layer; acquiring a defect energy Eti between the host material and the guest material in the single-carrier device corresponding to each of the light-emitting material groups; and screening, based on the defect energy Eti corresponding to each of the light-emitting material groups, a target light-emitting material group from the plurality of light-emitting material groups to serve as a light-emitting layer material of the light-emitting device.

DETAILED DESCRIPTION

Figure 1:
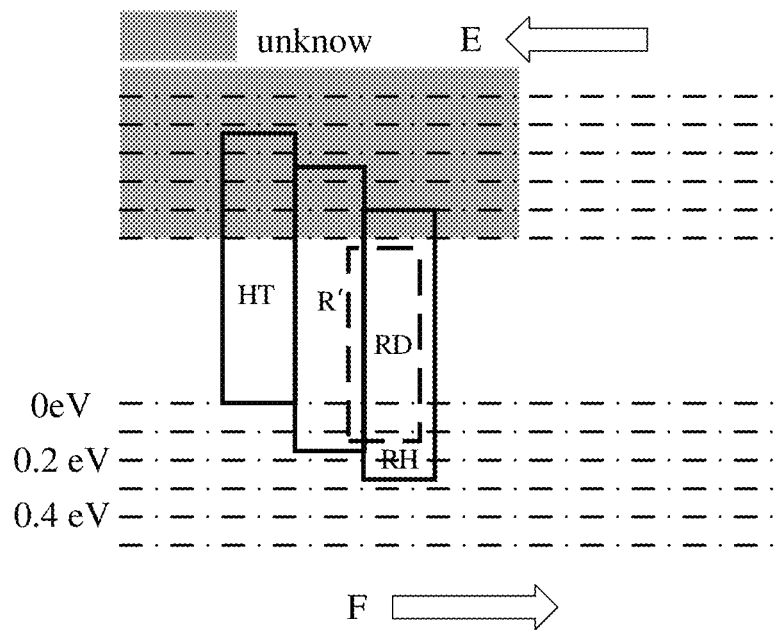
FIG. 1 is a relationship diagram of an activation energy level of each functional layer of a light-emitting device on a hole injection side of a light-emitting layer in one embodiment of the present application.

In order to better understand the present application, a light-emitting device, a material screening method, and a display panel provided by embodiments of the present application are described in detail below in conjunction with FIGS. 1 to 6.

The inventors have found through intensive studies that, in the case where a display panel is developed in a direction of high-luminance display, a roll-off condition of a light-emitting device in a high-luminance display state is serious. In general, the roll-off condition refers to a phenomenon that a light-emitting efficiency gradually increases to a maximum value and then decreases in a process of continuous increase of a current density. In a light-emitting efficiency decreasing stage, the faster the light-emitting efficiency decreasing rate, the more serious the roll-off condition. The serious roll-off condition not only affects a high-luminance display quality of the display panel, but also increases a power consumption of the display panel at a low light-emitting efficiency, which affects a use performance and lifetime of the display panel.

Generally, a luminance of the display panel is increased by increasing a pixel opening area of the light-emitting device to decrease a real luminance of the light-emitting device, however, the above practice requires sacrificing a high pixel density of the display panel, and it is difficult to effectively achieve an increase in an overall performance of the light-emitting device.

Accordingly, one aspect of the present application provides a light-emitting device having a light-emitting layer including a host material and a guest material. When a carrier is injected into the light-emitting layer, there is a defect energy Et between the host material and the guest material, and an absolute value of the defect energy Et is greater than or equal to 0.03 eV.

The light-emitting device of the present application can improve the light-emitting efficiency in the high-luminance display state while reducing an operating voltage of the light-emitting device, and thus reduce a power consumption of the light-emitting device itself, thereby achieving a reduction of an overall power consumption of the display panel.

In an embodiment, the light-emitting layer of the light-emitting device is a phosphorescent light-emitting layer, wherein the guest material is a phosphorescent light-emitting material. In these embodiments, a light-emitting color of the light-emitting layer may be blue, red, green, or the like.

In other embodiments, the light-emitting layer of the light-emitting device is a phosphorescent light-emitting layer, wherein the guest material is a phosphorescent light-emitting material, the host material is a phosphorescent light-emitting host material, and the light-emitting layer emits a primary color of red light or green light.

After studying green light-emitting devices and red light-emitting devices, the inventors have found that a host material and a guest material are included in a light-emitting layer of a light-emitting device. In general, the guest material is doped in the host material, and in a process of powering on the light-emitting device to emit light, electrons and holes are injected into the light-emitting layer from an electron injection direction and a hole injection direction respectively, and the guest material will form a carrier trap relative to the host material, and thus electrons and holes are not easily injected directly into the host material first but are more easily injected directly into the guest material, and carriers recombine on the guest material to form excitons to emit light. The carrier trap described above has an ability to trap carriers, i.e. holes and electrons, so that the energy required to overcome the carrier trap when carriers are injected into the host material is a defect energy Et. It can also be understood that there is a defect energy Et between the host material and the guest material when carriers are injected into the light-emitting layer. The inventors have also found that controlling the defect energy Et within a certain preset range can improve the light-emitting efficiency of the light-emitting device while ensuring an overall performance of the light-emitting device.

In some optional embodiments, the absolute value of the defect energy Et ranges from 0.03 eV to 0.08 eV.

In an embodiment of the present application, the following steps may be taken to acquire an absolute value range of a first standard defect state energy $Et_a$:

S01, fabricating a plurality of test monochromatic light-emitting devices, wherein the test monochromatic light-emitting devices test monochromatic light-emitting layers, a light-emitting layer material of each of the test monochromatic light-emitting devices is different from each other, and structures and functional layer materials of the remaining functional layers are all the same.

The light-emitting layer material of each of the test monochromatic light-emitting devices includes a host material and a guest material.

S02, acquiring test parameters of each of the test monochromatic light-emitting devices, and screening using a first standard test parameter to obtain a plurality of target test monochromatic light-emitting devices.

In some embodiments, the first standard test parameter is a light-emitting efficiency parameter of the light-emitting device.

S03, acquiring, in each of the target test monochromatic light-emitting devices, a defect energy $Et_j$ between the host material and the guest material of each light-emitting layer when carriers are injected into the light-emitting layer of each of the target test monochromatic light-emitting devices, wherein j≥1, and j is an integer;

The absolute value range of the first standard defect state energy $Et_a$ is determined based on a plurality of $Et_j$.

The defect energy Et between the host material and the guest material may be calculated according to the following equations:

$$Et = mkT \qquad \text{Equation (1);}$$

$$m = \log J / \log V \qquad \text{Equation (2);}$$

In Equations 1 and 2, Et is the defect energy, J is a current density, V is a preset voltage, k is a Boltzmann constant, and T is a preset temperature.

In some examples, a single-carrier device including a light-emitting layer of a light-emitting device is fabricated, the light-emitting layer includes a host material and a guest material, and a power-on test is performed on the single-carrier device to obtain an I-V curve, i.e. a current-voltage curve, of the single-carrier device at a preset temperature. Based on the current-voltage curve, the defect energy Et between the host material and the guest material is calculated using the above equations (1) and (2).

In some optional embodiments, the light-emitting device further includes a hole transport layer disposed on a hole injection side of the light-emitting layer, wherein there is a first activation energy difference $\Delta Ea_1$ between an activation energy of the host material and an activation energy of the hole transport layer, and an absolute value of the first activation energy difference $\Delta Ea_1$ ranges from 0.1 eV to 0.3 eV.

Referring to FIG. 1, there is a first activation energy difference $\Delta Ea_1$ between an activation energy of the host material and an activation energy of the hole transport layer, wherein the first activation energy difference $\Delta Ea_1 > 0$ eV. That is, in a hole injection direction of the light-emitting layer, the activation energy of the host material is larger than that of the hole transport layer. In some examples, the first activation energy difference $\Delta Ea_1$ ranges from 0.1 eV to 0.3 eV. In these examples, when a value of $\Delta Ea_1$ is within the above reasonable range, it is avoided that a large amount of holes accumulate in the light-emitting layer to affect a light-emitting performance of the light-emitting device when the value of $\Delta Ea_1$ is relatively small, and it is also avoided that a migration of holes is affected when the value of $\Delta Ea_1$ is relatively large.

In these optional embodiments, the light-emitting device further includes a compensation layer disposed between the hole transport layer and the light-emitting layer, wherein in the hole injection direction of the light-emitting layer, an activation energy of the compensation layer is between the activation energy of the hole transport layer and the activation energy of the host material. The activation energy of the compensation layer is between the activation energy of the hole transport layer and the activation energy of the host material.

In other embodiments, in the hole injection direction of the light-emitting layer, the activation energy of the compensation layer is the same as the activation energy of the hole transport layer, and both the activation energy of the compensation layer and the activation energy of the hole transport layer are lower than the activation energy of the host material. Alternatively, in the hole injection direction of the light-emitting layer, the activation energy of the compensation layer is higher than the activation energy of the hole transport layer and lower than the activation energy of the host material. Alternatively, in the hole injection direction of the light-emitting layer, the activation energy of the compensation layer is higher than the activation energy of the hole transport layer and is the same as the activation energy of the host material.

In some optional embodiments, the light-emitting device further includes an electron transport layer disposed on an electron injection side of the light-emitting layer, wherein there is a second activation energy difference $\Delta Ea_2$ between the activation energy of the host material and an activation energy of the electron transport layer, and an absolute value of the second activation energy difference $\Delta Ea_2$ ranges from 0.1 eV to 0.3 eV. In these examples, when a value of $\Delta Ea_2$ is within the above reasonable range, it is avoided that a large amount of electrons accumulate in the light-emitting layer to affect the light-emitting performance of the light-emitting device when the value of $\Delta Ea_2$ is relatively small, and it is also avoided that a migration of electrons is affected when the value of $\Delta Ea_2$ is relatively large.

In some embodiments, in an electron injection direction of the light-emitting layer, the activation energy of the host material is higher than the activation energy of the electron transport layer, and the second activation energy difference $\Delta Ea_2$ ranges from 0.1 eV to 0.3 eV.

Figure 2:
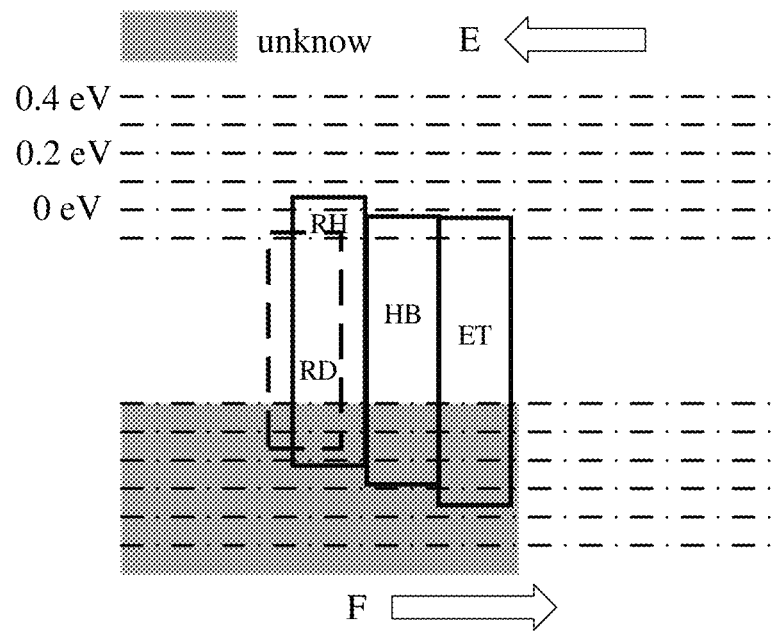
FIG. 2 is a relationship diagram of an activation energy level of each functional layer of a light-emitting device on an electron injection side of a light-emitting layer in another embodiment of the present application.

Referring to FIG. 2, the light-emitting device further includes a hole blocking layer disposed between the electron transport layer and the light-emitting layer, wherein in the electron injection direction of the light-emitting layer, an activation energy of the hole blocking layer is between the activation energy of the electron transport layer and the activation energy of the host material.

The activation energy of the hole blocking layer is between the activation energy of the electron transport layer and the activation energy of the host material. In the electron injection direction of the light-emitting layer, the activation energy of the hole blocking layer is the same as the activation energy of the electron transport layer, and both the activation energy of the hole blocking layer and the activation energy of the electron transport layer are lower than the activation energy of the host material. Alternatively, in the electron injection direction of the light-emitting layer, the activation energy of the hole blocking layer is higher than the activation energy of the electron transport layer and lower than the activation energy of the host material. Alternatively, in the electron injection direction of the light-emitting layer, the activation energy of the hole blocking layer is higher than the activation energy of the electron transport layer and is the same as the activation energy of the host material.

In the present application, the activation energy refers to a barrier that needs to be overcome for electrons or holes to transfer between different functional layers of a light-emitting device. In the present application, the activation energy of a single or multiple functional layers may be understood as a barrier that needs to be overcome for electrons (or holes) to flow through the single or multiple functional layers from a cathode side (or anode side). The above-mentioned functional layers refer to carrier layers and the light-emitting layer in the light-emitting device. The carrier layers in the light-emitting device includes an electron transport layer, a hole blocking layer, a compensation layer, a hole transport layer, a hole injection layer, and the like. Alternatively, the activation energy in the present application may also be understood as the energy required for electrons to flow through a functional layer(s) carrying electrons from the cathode side and for holes to flow through a functional layer(s) carrying holes from the anode side. An activation energy difference may be understood as the energy required for a carrier to flow from one functional layer to another functional layer in a certain carrier flow direction, such as the electron injection direction or the hole injection direction.

Under a condition that a functional layer is composed of a single material, an activation energy Ea of the material is an activation energy Ea corresponding to the functional layer. When a functional layer is composed of two or more materials, an activation energy of the functional layer may be calculated by: firstly, obtaining a product value of an activation energy of each of the materials and a molar mass fraction corresponding to each of the materials; then summing individual product values to obtain an overall activation energy, also referred to as a weighted average activation energy, of the functional layer. Under a condition that the light-emitting layer includes a host material and a guest material, an activation energy of the host material refers to an activation energy of the host material in the light-emitting layer.

The activation energy may be calculated using the Arrhenius equation as follows: $Ea=E_0+mRT$, where Ea is the activation energy, $E_0$ and m are temperature-independent constants, T is a temperature, and R a molar gas constant. That is, it can be seen from the above equation that the activation energy is related to the temperature. In addition, the unit of activation energy obtained by the above-mentioned calculation equation is Joule (J), and the above-mentioned unit of activation energy may be converted into electron volt (eV) by a simple conversion equation, wherein the conversion equation is: $1\ eV=1.602176565*10^{-19}$ J. It can be understood that one basic equation for calculating Ea is given in the present application, and those skilled in the art may calculate Ea on the basis of the basic Arrhenius equation given in the present application or a plurality of variations of the Arrhenius equation.

In some examples, calculating an activation energy of a carrier layer located on the hole injection side of the light-emitting layer and the activation energy of the light-emitting layer in the light-emitting device, an activation energy difference between carrier layers on the hole injection side, and an activation energy difference between the light-emitting layer and a carrier layer on the hole injection side may all be obtained by fabricating a single-hole device, and performing a power-on test on the single-hole device. The power-on test is performed on the single-hole device to obtain an I-V curve (i.e. a current-voltage curve) of the single-hole device, and on the basis of obtaining the I-V curve of the single-hole device, the activation energy is calculated using the Arrhenius equation or a plurality of variations of the Arrhenius equation.

As a specific example, in calculating an activation energy difference $\Delta Ea$ between the activation energy of the host material and the activation energy of the hole transport layer in the light-emitting device, a first single-hole device and a second single-hole device are fabricated. The first single-hole device having a hole transport layer is fabricated, and a power-on test is performed on the first single-hole device to obtain a first I-V curve, and $Ea_1$ of the hole transport layer is calculated using the Arrhenius equation. The second single-hole device having a hole transport layer and a light-emitting layer (having a host material) is fabricated, and a power-on test is performed on the second single-hole device so that holes flow from the hole transport layer to the light-emitting layer to obtain a second I-V curve, and Eat of the hole transport layer and the light-emitting layer (having only a host material) is calculated using the Arrhenius equation. The difference $\Delta Ea$ between the activation energy of the host material and the activation energy of the hole transport layer in the light-emitting device may be calculated using a difference calculation method, i.e. according to $\Delta Ea=Ea_2-Ea_1$.

In some examples, a single-hole device allows only holes to pass through. The first single-hole device may include an anode, a first hole transport layer, an electron blocking layer, and a cathode arranged in a stack. The second single-hole device may include an anode, a second hole transport layer, a light-emitting layer (having only a host material), an electron blocking layer, and a cathode arranged in a stack. The first hole transport layer is the same as the second hole transport layer, and a power-on test, with only the light-emitting layer (having only a host material) as a single variable, is performed on the first single-hole device and the second single-hole device. In addition, the electron blocking layer is capable of blocking transport of electrons generated by the cathode in the single-hole device, thereby achieving a goal that the single-hole device allows transport of only holes.

In some embodiments, calculating an activation energy of a carrier layer located on the electron injection side of the light-emitting layer and the activation energy of the light-emitting layer in the light-emitting device, an activation energy difference between carrier layers on the electron injection side, and an activation energy difference between the light-emitting layer and a carrier layer on the electron injection side may all be obtained by fabricating a single-electron device, and performing a power-on test on the single-electron device. The power-on test is performed on the single-electron device to obtain an I-V curve (i.e. a current-voltage curve) of the single-hole device, and on the basis of obtaining the I-V curve of the single-electron device, the activation energy is calculated using the Arrhenius equation or a plurality of variations of the Arrhenius equation.

As a specific example, in calculating an activation energy difference $\Delta Ea'$ between the activation energy of the host material and the activation energy of the electron transport layer in the light-emitting device, a first single-electron device and a second single-electron device are fabricated. The first single-electron device having an electron transport layer is fabricated, and a power-on test is performed on the first single-electron device to obtain a first I-V curve, and $Ea_1'$ of the electron transport layer is calculated using the Arrhenius equation. The second single-electron device having an electron transport layer and a light-emitting layer (having only a host material) is fabricated, and a power-on test is performed on the second single-electron device so that electrons flow from the electron transport layer to the light-emitting layer to obtain a second I-V curve, and $Ea_2'$ of the electron transport layer and the light-emitting layer (having only a host material) is calculated using the Arrhenius equation. The difference $\Delta Ea'$ between the activation energy of the host material and the activation energy of the electron transport layer in the light-emitting device may be calculated using a difference calculation method, i.e. according to $\Delta Ea'=Ea_2'-Ea_1'$.

In some examples, a single-electron device allows only electrons to pass through. The first single-electron device may include an anode, a hole blocking layer, a first electron transport layer, and a cathode arranged in a stack. The second single-electron device may include an anode, a hole blocking layer, a light-emitting layer (having only a host material), a second electron transport layer, and a cathode arranged in a stack. The first electron transport layer is the same as the second electron transport layer, and a power-on test, with only the light-emitting layer (having only a host material) as a single variable, is performed on the first single-electron device and the second single-electron device. In addition, the hole blocking layer is capable of blocking transport of holes generated by the anode in the single-electron device, thereby achieving a goal that the single-electron device allows transport of only electrons.

In other embodiments, an activation energy of a functional layer may be obtained by a method of thermogravimetric analysis. For example, thermogravimetric analysis is performed on the whole of a first carrier layer and a monochromatic light-emitting layer, and an activation energy of each of the above-mentioned functional layers is directly calculated from a result of the thermogravimetric analysis. Thermogravimetric analysis refers to a method of obtaining a relationship that a mass of a substance changes with a temperature (or time) under a program-controlled temperature; when a thermogravimetric curve is obtained by the thermogravimetric analysis technique, an average activation energy may be calculated by a difference-subtraction differential (Freeman-Carroll) method or an integral (OWAZa) method or the like.

The highest occupied energy level orbital (HOMO) and the lowest unoccupied energy level orbital (LUMO) are generally used to measure an energy level matching of each functional layer in a light-emitting device. However, the HOMO energy level and the LUMO energy level only consider an efficiency of carrier injection, and do not consider factors such as an interface factor between functional layers and the temperature. Designing and matching each functional layer in the light-emitting device only via the HOMO energy level and the LUMO energy level tends to cause a large error between a performance parameter of a finished light-emitting device and an expected performance that a designed light-emitting device should have.

In some optional embodiments of the present application, on one hand, when designing a red or green light-emitting device, a defect energy Et between the host material and the guest material in the light-emitting layer is found to have an effect on the light-emitting efficiency of the light-emitting device in the high-luminance display state. By measuring a matching relationship between the host material and the guest material of the light-emitting layer in the light-emitting device using the defect energy Et between the host material and the guest material of the light-emitting layer, the light-emitting efficiency of the light-emitting device can be improved more effectively.

On the other hand, on the basis of considering the defect energy Et between the host material and the guest material of the light-emitting layer, further starting from a direction of activation energy Ea, an energy level matching relationship of the activation energy Ea of each functional layer in the light-emitting device is considered. Starting from the direction of activation energy, it is able to comprehensively consider effects of various factors such as carrier injection between functional layers, carrier transport between functional layers and temperature in practical use of the light-emitting device on an overall performance of the light-emitting device.

In some embodiments, the light-emitting device has a defect energy Et between the host material and the guest material when carriers are injected into the light-emitting layer, and an absolute value of the defect energy Et is greater than or equal to 0.03 eV. In addition, there is a first activation energy difference $\Delta Ea_1$ between the activation energy of the host material and the activation energy of the hole transport layer, and an absolute value of the first activation energy difference $\Delta Ea'$ ranges from 0.1 eV to 0.3 eV.

The light-emitting device further includes the electron transport layer disposed on the electron injection side of the light-emitting layer, there is a second activation energy difference $\Delta Ea_2$ between the activation energy of the host material and the activation energy of the electron transport layer, and an absolute value of the second activation energy difference $\Delta Ea_2$ ranges from 0.1 eV to 0.3 eV. In these embodiments, a light-emitting device considering both the defect energy Et and the activation energy Ea increases the light-emitting efficiency by 0% to 15% and extends a light-emitting lifetime by 0% to 40% as compared to a light-emitting device only satisfying that the absolute value of the defect energy Et between the host material and the guest material is greater than or equal to 0.03 eV.

In order to embody the effect of improving the light-emitting efficiency of the light-emitting device provided in the present application in the high-luminance display state, a set of comparative experiments as follows is designed. A comparative example 1 and an experimental example 1 are included in the comparative experiments. The comparative example 1 is a first red light-emitting device, wherein an absolute value of a defect energy Et1 between a host material and a guest material in a light-emitting layer of the first red light-emitting device is less than 0.03 eV. The experimental example 1 is a second red light-emitting device, wherein an absolute value of a defect energy Et2 between a host material and a guest material in a light-emitting layer of the second red light-emitting device is greater than 0.03 eV and less than 0.08 eV. In this set of comparative experiments, experiments are performed with only the defect energy Et between the host material and the guest material in the light-emitting layer of a red light-emitting device as a variable.

TABLE 1

Test experiment results of the comparative example 1 and the experimental example 1

| | Defect energy Et | CIEx | L(nits) | Vd(V) | Eff. (cd/A) |
|---|---|---|---|---|---|
| Comparative example 1 | Et1 < 0.03 eV | 0.688 | 6000 | $Vd_0$ | 100% |
| Experimental example 1 | 0.03 eV < Et2 < 0.08 eV | 0.684 | 6000 | $Vd_0$ − 0.03 V | 110.2% |

CIEx in Table 1 is a color coordinate and refers to a red light emitted by a red light-emitting device. L is a light-emitting luminance of the first red light-emitting device and the second red light-emitting device. Nits is a unit of light-emitting luminance, and in the experimental test, the first red light-emitting device and the second red light-emitting device are both in a high-luminance display state, and a luminance is 6000 nits. Vd represents an operating voltage of the light-emitting device, an operating voltage of the first red light-emitting device in the comparative example 1 is taken as a reference voltage value $Vd_0$, an operating voltage of the second red light-emitting device in the experimental example 1 is lower than the operating voltage of the first red light-emitting device in the comparative example 1, and the operating voltage of the second red light-emitting device in the experimental example 1 is lower by 0.03V, so that a power consumption of the second red light-emitting device is lower than that of the first red light-emitting device. Eff. represents a light-emitting efficiency of a light-emitting device, and it can be seen from Table 1 that the light-emitting efficiency of the second red light-emitting device is 10.2% higher than that of the first red light-emitting device.

According to the results of the comparative experiments shown in Table 1, for the light-emitting device in embodiments of the present application, when carriers are injected into the light-emitting layer, there is a defect energy Et between the host material and the guest material, and the defect energy Et>0.03 eV, which can improve the light-emitting efficiency of the light-emitting device in the high-luminance display state and reduce the operating voltage of the light-emitting device, and the power consumption of the light-emitting device is further reduced, which in turn reduces an overall power consumption of the display panel.

Figure 3:
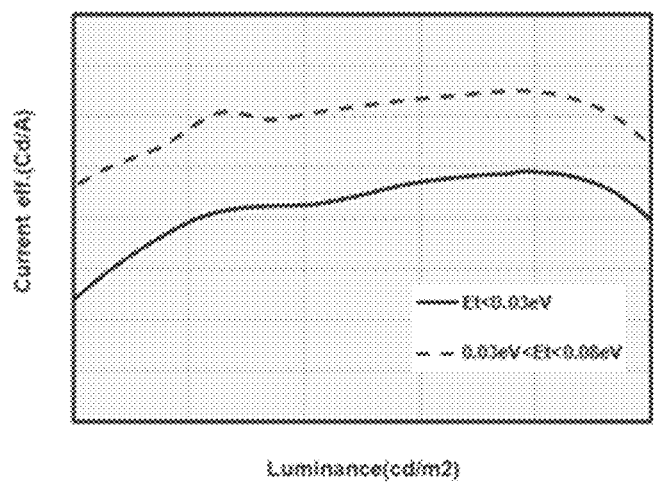
FIG. 3 is a graph of a relationship between a light-emitting efficiency and a light-emitting luminance of a light-emitting device in a set of comparative experiments of the present application.

FIG. 3 shows a graph of a relationship between a light-emitting efficiency and a light-emitting luminance of the first red light-emitting device and the second red light-emitting device during a test process in the comparative experiments. It can be seen from FIG. 3 that, as the light-emitting luminance of the light-emitting devices increase, the light-emitting efficiency of the second red light-emitting device is always above the light-emitting efficiency of the first red light-emitting device.

Figure 4:
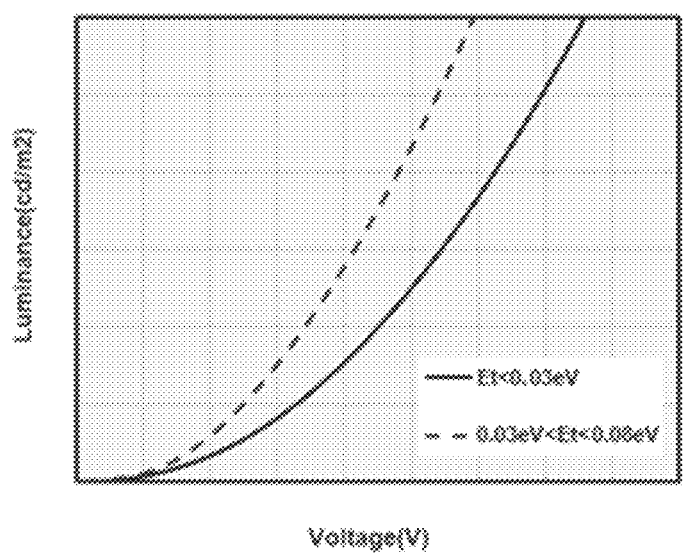
FIG. 4 is a graph of a relationship between an operating voltage and a light-emitting efficiency of a light-emitting device in a set of comparative experiments of the present application.

FIG. 4 shows a graph of a relationship between an operating voltage and a light-emitting efficiency of the first red light-emitting device and the second red light-emitting device during a test process in the comparative experiments. It can be seen from FIG. 4 that the operating voltage of the first red light-emitting device is greater than that of the second red light-emitting device at a same light-emitting luminance.

In order to further embody that when carriers are injected into the light-emitting layer, the light-emitting device has a more excellent light-emitting effect under a condition that the light-emitting device satisfies: there is a defect energy Et between the host material and the guest material having an absolute value greater than or equal to 0.03 eV; and the absolute value of the first activation energy difference $\Delta Ea_1$ ranges from 0.1 eV to 0.3 eV, and/or the absolute value of the second activation energy difference $\Delta Ea_2$ ranges from 0.1 eV to 0.3 eV, another set of comparative experiments is carried out. The set of comparative experiments has one comparative example 2, one experimental example 2, one experimental example 3, and one experimental example 4.

TABLE 2

Test experiment results of the comparative example 2 and the experimental examples 2, 3 and 4

| | Defect energy Et | $|\Delta Ea_1|$ | $|\Delta Ea_2|$ | CIEx (emitting red) | LT97@6000nits (lifetime) | Vd (V) (operating voltage) | Eff. (cd/A) light-emitting efficiency |
|---|---|---|---|---|---|---|---|
| Comparative example 2 | 0.03 eV < Et < 0.08 eV | Fails to comply with 0.1 eV ≤$|\Delta Ea_1|$≤ 0.3 eV | Fails to comply with 0.1 eV ≤$|\Delta Ea_2|$≤ 0.3 eV | 0.684 | 100% | $Vd_1$ | 100% (based on the comparative example 2) |

TABLE 2-continued

Test experiment results of the comparative example 2 and the experimental examples 2, 3 and 4

|  | Defect energy Et | $|\Delta\ Ea_1|$ | $|\Delta\ Ea_2|$ | CIEx (emitting red) | LT97@6000nits (lifetime) | Vd (V) (operating voltage) | Eff. (cd/A) light-emitting efficiency |
|---|---|---|---|---|---|---|---|
| Experimental example 2 | 0.03 eV < Et < 0.08 eV | Complies with 0.1 eV ≤ $|\Delta\ Ea_1|$ ≤ 0.3 eV | Fails to comply with 0.1 eV ≤ $|\Delta\ Ea_2|$ ≤ 0.3 eV | 0.684 | 123% | $Vd_1$-0.11 V | 105% |
| Experimental example 3 | 0.03 eV < Et < 0.08 eV | Fails to comply with 0.1 eV ≤ $|\Delta\ Ea_1|$ ≤ 0.3 eV | Complies with 0.1 eV ≤ $|\Delta\ Ea_2|$ ≤ 0.3 eV | 0.688 | 120% | $Vd_1$-0.10 V | 104% |
| Experimental example 4 | 0.03 eV < Et < 0.08 eV | Complies with 0.1 eV ≤ $|\Delta\ Ea_1|$ ≤ 0.3 eV | Complies with 0.1 eV ≤ $|\Delta\ Ea_2|$ ≤ 0.3 eV | 0.687 | 140% | $Vd_1$-0.32 V | 112.2% |

From color coordinate values in Table 2, it can be seen that the comparative example 2, the experimental example 2, the experimental example 3, and the experimental example 4 are all red light-emitting devices, and the light-emitting devices emit red light. LT97@6000 nits means: at an initial light-emitting luminance of 6000 nits, the time elapsed when a light-emitting luminance of a red light-emitting device decays to 97% of the initial light-emitting luminance, and a light-emitting lifetime of the light-emitting device is represented by LT97@6000 nits.

Taking a light-emitting lifetime of a light-emitting device in the comparative example 2 as a reference value, a light-emitting lifetime of the experimental example 2 is increased by 23% as compared to the light-emitting lifetime of the comparative example 2, a light-emitting lifetime of the experimental example 3 is increased by 20% as compared to the light-emitting lifetime of the comparative example 2, and a light-emitting lifetime of the experimental example 4 is increased by 40% as compared to the light-emitting lifetime of the comparative example 2. Vd is an operating voltage, and taking an operating voltage in the comparative example 2 as a reference value, an operating voltage of the experimental example 2 is reduced by 0.11V as compared to the operating voltage of the comparative example 2, an operating voltage of the experimental example 3 is reduced by 0.10V as compared to the operating voltage of the comparative example 2, and an operating voltage of the experimental example 4 is reduced by 0.32V as compared to the operating voltage of the comparative example 2. The reduction of the operating voltage can reduce the power consumption of the light-emitting device in a process of emitting light, and reduce an overall display power consumption of the display panel. However, while the power consumption of the light-emitting device is reduced, a light-emitting efficiency of the experimental example 2 is improved by 5% as compared to the comparative example 2, a light-emitting efficiency of the experimental example 3 is improved by 4% as compared to the comparative example 2, and a light-emitting efficiency of the experimental example 4 is improved by 12.2% as compared to the comparative example 2.

The above data show that, on the basis that a light-emitting device satisfies that there is a defect energy Et having an absolute value greater than or equal to 0.03 eV between the host material and the guest material, under a condition that the absolute value of the first activation energy difference $\Delta Ea_1$ ranges from 0.1 eV to 0.3 eV, and/or the absolute value of the second activation energy difference $\Delta Ea_2$ ranges from 0.1 eV to 0.3 eV, the light-emitting lifetime of the light-emitting device is a longer, and the operating voltage is reduced, the power consumption is reduced, and the light-emitting efficiency of the light-emitting device is further improved.

Figure 5:
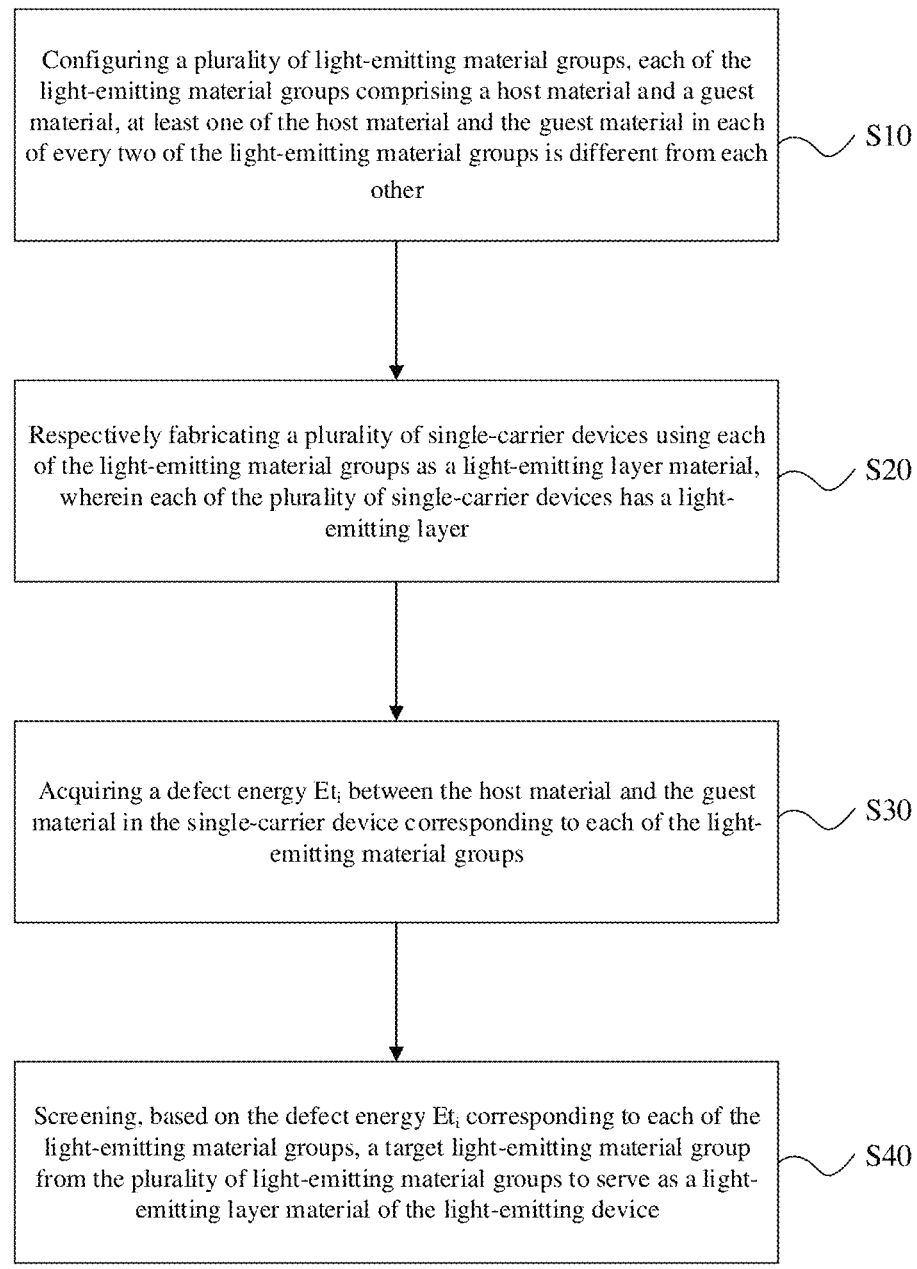
FIG. 5 is a flow chart of steps of a material screening method in one embodiment of the present application.

An embodiment of the present application further provides a material screening method for screening a light-emitting layer material of a green or red light-emitting device, please refer to FIG. 5, the method includes the following steps.

S10, configuring a plurality of light-emitting material groups, each of the light-emitting material groups includes a host material and a guest material, at least one of the host material and the guest material in each of every two of the light-emitting material groups is different from each other.

S20, respectively fabricating a plurality of single-carrier devices using each of the light-emitting material groups as a light-emitting layer material, wherein each of the plurality of single-carrier devices has a light-emitting layer.

S30, acquiring a defect energy $Et_i$ between the host material and the guest material in the single-carrier device corresponding to each of the light-emitting material groups;

S40, screening, based on the defect energy $Et_i$ corresponding to each of the light-emitting material groups, a target light-emitting material group from the plurality of light-emitting material groups to serve as a light-emitting layer material of the light-emitting device.

In some optional embodiments, in step S30, each of the single-carrier devices is a single-hole device, each of the single-carrier devices further includes a hole transport layer stacked on the light-emitting layer and located on a hole injection side of the light-emitting layer, and the hole transport layer of each of the single-carrier devices is the same. In some embodiments, a hole transport layer of the light-emitting device is the same as the hole transport layer of each of the single-carrier devices.

In other optional embodiments, each of the single-carrier devices is a single-electron device, each of the single-carrier devices further includes an electron transport layer stacked on the light-emitting layer and located on an electron injection side of the light-emitting layer, and the electron transport layer of each of the single-carrier devices is the same. In some embodiments, an electron transport layer of the light-emitting device is the same as the electron transport layer of each of the single-carrier devices.

In some examples, a hole transport layer in a single-hole device is the same as the hole transport layer in the light-emitting device. Generally, a hole transport layer is formed by evaporation of a whole layer in a display panel, and needs to cooperate with operating performance of three light-emitting devices of red, green and blue. Therefore, when screening a material of a light-emitting layer, providing a same hole transport layer as the light-emitting device in a single-hole device can also take into account an effect of the hole transport layer on the defect energy Et between the host material and the guest material of the light-emitting layer in the light-emitting device during a hole transport process, therefore the material of the light-emitting layer which improves the efficiency of the light-emitting device can be screened more accurately.

In other examples, an electron transport layer in a single-electron device is the same as the electron transport layer in the light-emitting device. Generally, an electron transport layer is formed by evaporation of a whole layer in a display panel, and needs to cooperate with operating performance of three light-emitting devices of red, green and blue. Therefore, when screening a material of a light-emitting layer, providing a same electron transport layer as the light-emitting device in a single-electron device can also take into account an effect of the electron transport layer on the defect energy Et between the host material and the guest material of the light-emitting layer in the light-emitting device during an electron transport process, therefore the material of the light-emitting layer which improves the efficiency of the light-emitting device can be screened more accurately.

Figure 6:
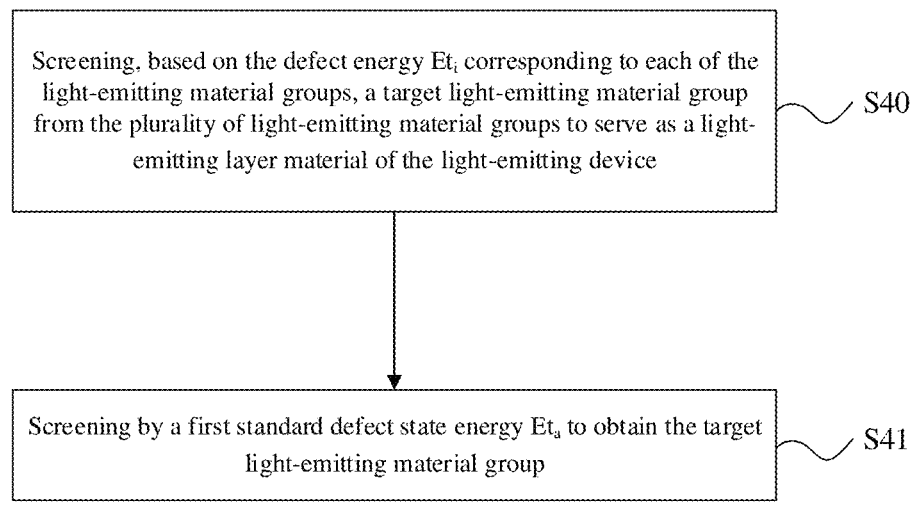
FIG. 6 is a flow chart of steps of a material screening method in another embodiment of the present invention.

Referring to FIG. 6, the step of S40 includes step S41.

Step S41: screening by a first standard defect state energy $Et_a$ to obtain the target light-emitting material group.

In some embodiments, an absolute value of the first standard defect state energy $Et_a$ ranges from 0.03 eV to 0.08 eV.

The light-emitting layer material screened by the material screening method provided in the present application can improve the light-emitting efficiency of the light-emitting device in the high-luminance display state and reduce the power consumption, which ensures the display quality and display effect of the display panel in the high-luminance display state, and at the same time reduces the overall power consumption of the display panel.

The display panel provided in the present application has the above-mentioned light-emitting device. The display panel of the present application improves the display quality in the high-luminance display state while reducing the power consumption.

What is claimed is:

1. A light-emitting device, comprising:
   a light-emitting layer comprising a host material and a guest material,
   wherein when a carrier is injected into the light-emitting layer, there is a defect energy Et between the host material and the guest material, and an absolute value of the defect energy Et is greater than or equal to 0.03 eV;
   wherein the defect energy Et is determined by the equation Et=mkT;
   wherein m=log J/log V;
   wherein Et is the defect energy, J is a current density, V is a preset voltage, k is a Boltzmann constant, and T is a preset temperature.

2. The light-emitting device of claim 1, wherein
   the absolute value of the defect energy Et ranges from 0.03 eV to 0.08 eV.

3. The light-emitting device of claim 1, wherein
   the light-emitting layer is a phosphorescent light-emitting layer, wherein the guest material is a phosphorescent light-emitting material.

4. The light-emitting device of claim 3, wherein the light-emitting layer emits a primary color of red light or green light.

5. The light-emitting device of claim 1, further comprising a hole transport layer disposed on a hole injection side of the light-emitting layer,
   wherein there is a first activation energy difference $\Delta Ea_1$ between an activation energy of the host material and an activation energy of the hole transport layer, and an absolute value of the first activation energy difference $\Delta Ea_1$ ranges from 0.1 eV to 0.3 eV.

6. The light-emitting device of claim 5, wherein the first activation energy difference $\Delta Ea_1$ ranges from 0.1 eV to 0.3 eV.

7. The light-emitting device of claim 5, further comprising a compensation layer disposed between the hole transport layer and the light-emitting layer,
   wherein in a hole injection direction of the light-emitting layer, an activation energy of the compensation layer is between the activation energy of the hole transport layer and the activation energy of the host material.

8. The light-emitting device of claim 1, further comprising an electron transport layer disposed on an electron injection side of the light-emitting layer,
   wherein there is a second activation energy difference $\Delta Ea_2$ between an activation energy of the host material and an activation energy of the electron transport layer, and an absolute value of the second activation energy difference $\Delta Ea_2$ ranges from 0.1 eV to 0.3 eV.

9. The light-emitting device of claim 8, wherein
   the second activation energy difference $\Delta Ea_2$ ranges from 0.1 eV to 0.3 eV.

10. The light-emitting device of claim 8, further comprising a hole blocking layer disposed between the electron transport layer and the light-emitting layer,
    wherein in an electron injection direction of the light-emitting layer, an activation energy of the hole blocking layer is between the activation energy of the electron transport layer and the activation energy of the host material.

11. A display panel comprising the light-emitting device of claim 1.

12. A material screening method for screening a light-emitting layer material of a green or red light-emitting device, comprising:
    configuring a plurality of light-emitting material groups, each of the light-emitting material groups comprising a host material and a guest material, at least one of the host material and the guest material in each of every two of the light-emitting material groups is different from each other;
    respectively fabricating a plurality of single-carrier devices using each of the light-emitting material groups as a light-emitting layer material, wherein each of the plurality of single-carrier devices has a light-emitting layer;
    acquiring a defect energy $Et_i$ between the host material and the guest material in the single-carrier device corresponding to each of the light-emitting material groups; and screening, based on the defect energy $Et_i$ corresponding to each of the light-emitting material groups, a target light-emitting material group from the plurality of light-emitting material groups to serve as a light-emitting layer material of the light-emitting device.

13. The material screening method of claim 12, wherein each of the single-carrier devices is a single-hole device, each of the single-carrier devices further comprises a hole transport layer stacked on the light-emitting layer and located on a hole injection side of the light-emitting layer, and the hole transport layer of each of the single-carrier devices is the same.

14. The material screening method of claim 13, wherein a hole transport layer of the light-emitting device is the same as the hole transport layer of each of the single-carrier devices.

15. The material screening method of claim 12, wherein each of the single-carrier devices is a single-electron device, each of the single-carrier devices further comprises an electron transport layer stacked on the light-emitting layer and located on an electron injection side of the light-emitting layer, and the electron transport layer of each of the single-carrier devices is the same.

16. The material screening method of claim 15, wherein an electron transport layer of the light-emitting device is the same as the electron transport layer of each of the single-carrier devices.

17. The material screening method of claim 12, wherein the screening, based on the defect energy $Et_i$ corresponding to each of the light-emitting material groups, a target light-emitting material group from the plurality of light-emitting material groups to serve as a light-emitting layer material of the light-emitting device comprises:

screening by a first standard defect state energy $Et_a$ to obtain the target light-emitting material group.

18. The material screening method of claim 17, wherein an absolute value of the first standard defect state energy $Et_a$ ranges from 0.03 eV to 0.08 eV.

* * * * *